(12) United States Patent
Xu et al.

(10) Patent No.: US 9,954,293 B2
(45) Date of Patent: Apr. 24, 2018

(54) CIRCUIT BOARD ASSEMBLY

(71) Applicants: INVENTEC (PUDONG) TECHNOLOGY CORPORATION, Shanghai (CN); INVENTEC CORPORATION, Taipei (TW)

(72) Inventors: Ji-Peng Xu, Shanghai (CN); Guang-Zhao Tian, Shanghai (CN); Yang-Qiu Lai, Shanghai (CN); Xiang-Biao Sha, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 189 days.

(21) Appl. No.: 14/996,855

(22) Filed: Jan. 15, 2016

(65) Prior Publication Data

US 2017/0194723 A1    Jul. 6, 2017

(30) Foreign Application Priority Data

Jan. 5, 2016    (CN) .......................... 2016 1 0004536

(51) Int. Cl.
*H05K 3/32* (2006.01)
*H01R 12/70* (2011.01)
*H01R 12/71* (2011.01)
*H05K 1/02* (2006.01)

(52) U.S. Cl.
CPC ..... *H01R 12/7047* (2013.01); *H01R 12/7088* (2013.01); *H05K 3/325* (2013.01); *H01R 12/712* (2013.01); *H05K 1/0263* (2013.01); *H05K 2201/09063* (2013.01); *H05K 2201/1031* (2013.01); *H05K 2201/10272* (2013.01); *H05K 2201/10409* (2013.01); *H05K 2201/10962* (2013.01); *H05K 2203/167* (2013.01)

(58) Field of Classification Search
None
See application file for complete search history.

(56) References Cited

U.S. PATENT DOCUMENTS

| | | | | |
|---|---|---|---|---|
| 4,867,696 A | * | 9/1989 | Demler, Jr. ............ | H02G 5/005 174/72 B |
| 2011/0221268 A1 | * | 9/2011 | Kanazawa ........... | H05K 1/0263 307/10.1 |
| 2013/0203289 A1 | * | 8/2013 | Ota ........................ | B61G 5/10 439/607.01 |
| 2015/0077942 A1 | * | 3/2015 | Roche ................. | H01L 23/3735 361/708 |

* cited by examiner

*Primary Examiner* — Courtney Smith
*Assistant Examiner* — Jessey R Ervin
(74) *Attorney, Agent, or Firm* — Muncy, Geissler, Olds & Lowe, P.C.

(57) ABSTRACT

A circuit board assembly includes a circuit board, at least one metal sheet, at least one bus and at least one fixed member. The circuit board has at least one electrical connecting area. The metal sheet is adapted to solder to the electrical connecting area and has at least one metal sheet hole. The bus has a connecting portion. The connecting portion is corresponding to the metal sheet. The bus has at least one fixed screwing hole. The fixed screwing hole is corresponding to the metal sheet hole. The circuit board and the bus is locked by the fixed member.

9 Claims, 8 Drawing Sheets

CIRCUIT BOARD ASSEMBLY

BACKGROUND OF INVENTION

1. Field of the Invention

The present invention relates to a circuit board assembly, and more particularly to a circuit board assembly having a bus, a circuit board, and a metal sheet, wherein the bus is electrically connected to the circuit board by the metal sheet.

2. Description of the Prior Art

In general, a circuit board assembly used to couple the power supply is a necessary component in a integral electromechanical system, and the current circuit board assembly has at least one port to be plug by the bus of the power supply. However, in the above design, the tightness of the contacting status is insufficiently, and the conducting capacity is finite. Especially, when the design is applied in server or storage device, a large electricity supply is need and then more problems will be generated.

Referring to FIG. 1, FIG. 1 is a three-dimensional schematic drawing illustrating the circuit board assembly in prior art. As shown in FIG. 1, a circuit board assembly PA100 includes a circuit board PA1 and two buses PA2 (FIG. 1 just shows one), wherein two plugging ports PA12 (FIG. 1 just shows one) are disposed on the circuit board PA1. The two buses PA2 are plugged into the two plugging ports PA12 respectively for connecting to the circuit of the circuit board PA1 electrically.

From above, because the current circuit board PA1 is just configured with at least one plugging port PA12 to be plugged for the bus PA2, thus the contact between the bus PA2 and the plugging port PA12 just can be via the metal elastic-element configured inside of the plugging port PA12. Therefore, when the metal elastic-element being in a status of elastic fatigue, the poor contact is occurred easily.

SUMMARY OF THE INVENTION

To sum up, the poor contact is occurred frequently to cause damage and poor efficacy of power transmission when the plugging port is disposed on the circuit board to be plugged for the bus directly in the current circuit board assembly; accordingly, a circuit board assembly is provided, which is soldered on circuit board via the metal sheet, and then the bus is locked on the circuit board and metal sheet. Therefore, the bus can be contacted tightly and electrically connected to the metal sheet of the circuit board by the way of locking.

In order to solve the problems of prior art, the present invent provides a circuit board assembly, which includes a circuit board, at least one metal sheet, at least one bus, and at least one fixed member. The circuit board has at least one electrical connecting area; the metal sheet is adapted to solder to the electrical connecting area and has at least one metal sheet hole; the bus has a connecting portion, the connecting portion is corresponding to the metal sheet, and the bus has at least one fixed screwing hole, the fixed screwing hole is corresponding to the metal sheet hole; the metal sheet and the bus are locked by the fixed member via the metal sheet hole and the fixed screwing hole for making a electrical connection between the metal sheet and the bus.

According to an embodiment of the present invention, the bus is locked on the circuit board by the fixed member with a rotational torque for reducing a impedance value between the bus and the circuit board, a range of the rotational torque is between 20-40 kgf·cm.

According to an embodiment of the present invention, when the rotational torque increases by degrees in the range of the rotational torque, the impedance value decreases by degrees relatively.

According to an embodiment of the present invention, the circuit board has at least one circuit board locking hole corresponding to the metal sheet holes, the metal sheet and the bus are locked on the circuit board by the fixed member via the circuit board locking hole.

According to an embodiment of the present invention, the circuit board further has at least one positioning hole, the positioning hole is adjacent to the electrical connecting area, and the metal sheet has at least one positioning portion, the positioning portion is wedged in the positioning hole.

According to an embodiment of the present invention, there are plural positioning holes and positioning portions, the positioning holes are disposed around the electrical connecting area symmetrically, the positioning portions are wedged in the positioning holes correspondingly.

According to an embodiment of the present invention, the metal sheet is copper sheet.

According to an embodiment of the present invention, the bus is copper piece.

According to an embodiment of the present invention, the bus further includes a bus body, the connecting portion is extended from the bus body integrally by the way of bending.

According to an embodiment of the present invention, the extending direction of the connecting portion is vertical to the extending direction of the bus body.

As described above, compared to the circuit board assembly of prior art with plugging port for plugging by the bus directly, the present invent applies the metal sheet to electrically connect with the circuit board and the bus. Thus, the present invent can make the bus electrically connect to circuit board effectively, and increases the stability of the electrical connection between the bus and the circuit board.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a historical work parameter. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
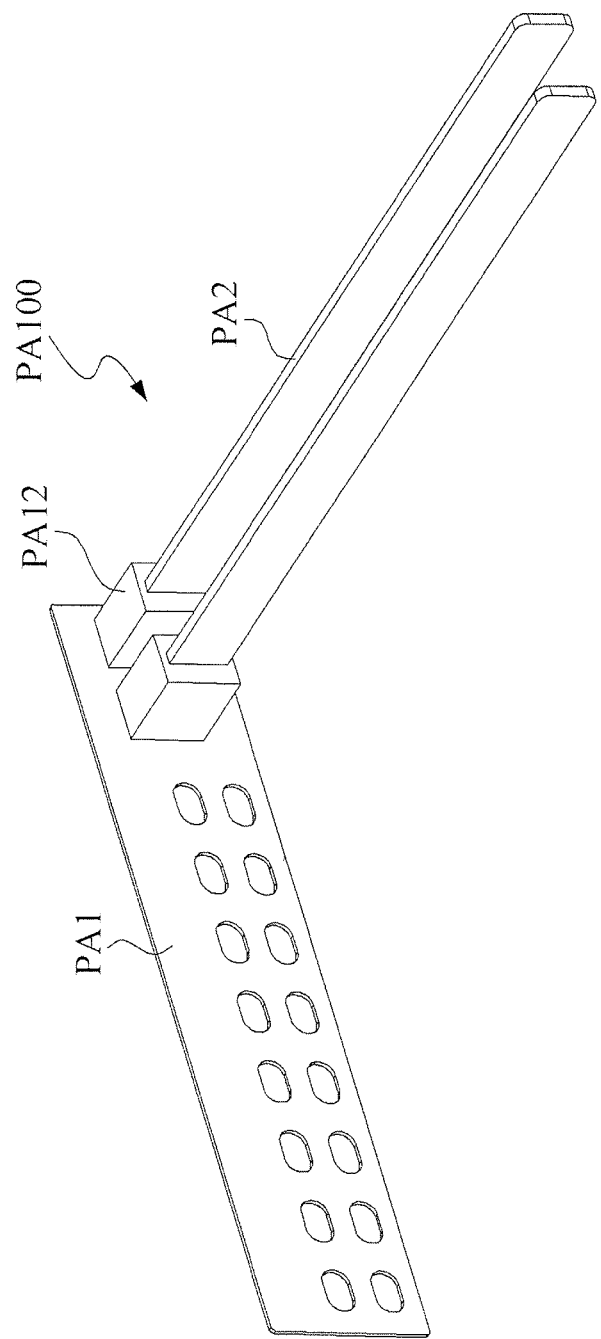
FIG. 1 is a three-dimensional schematic drawing illustrating the circuit board assembly in prior art.
Figure 2:
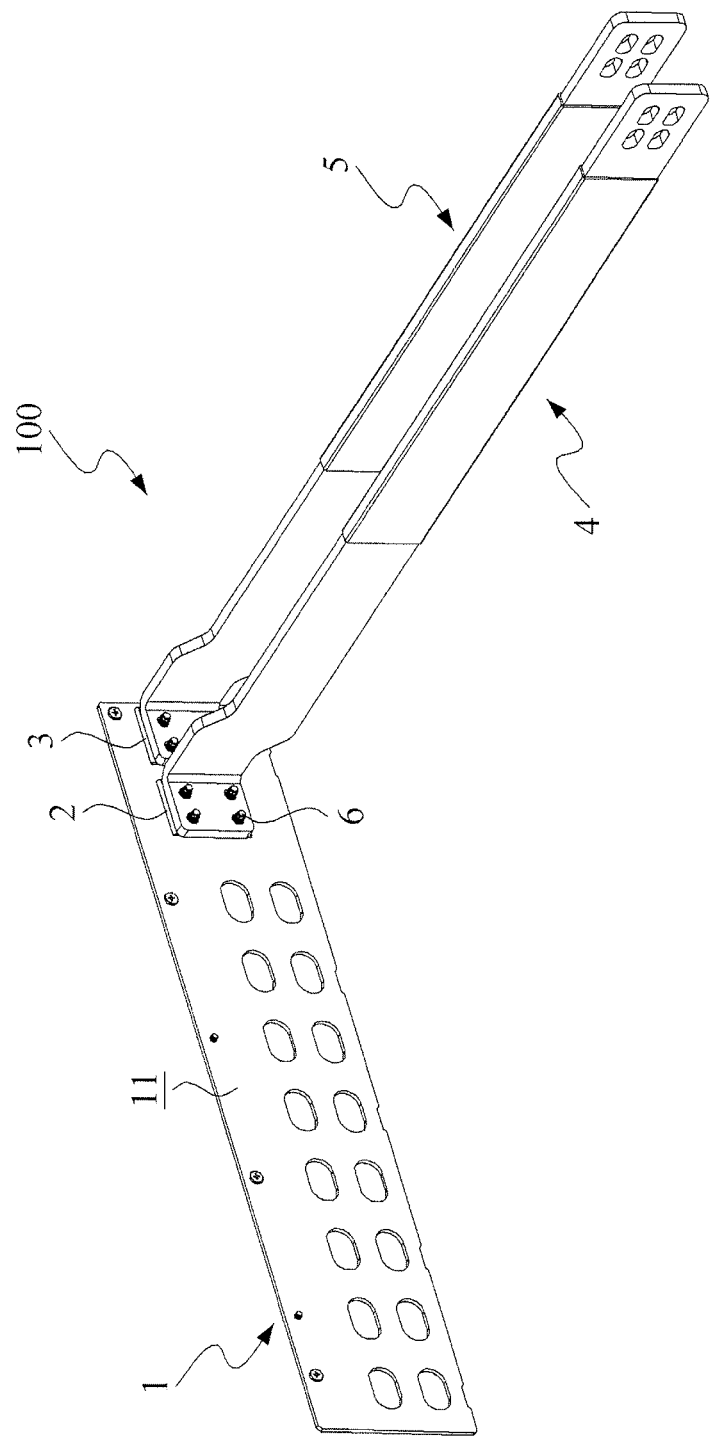
FIG. 2 is a three-dimensional schematic drawing illustrating the circuit board assembly according to one preferred embodiment of the present invention.
Figure 3:
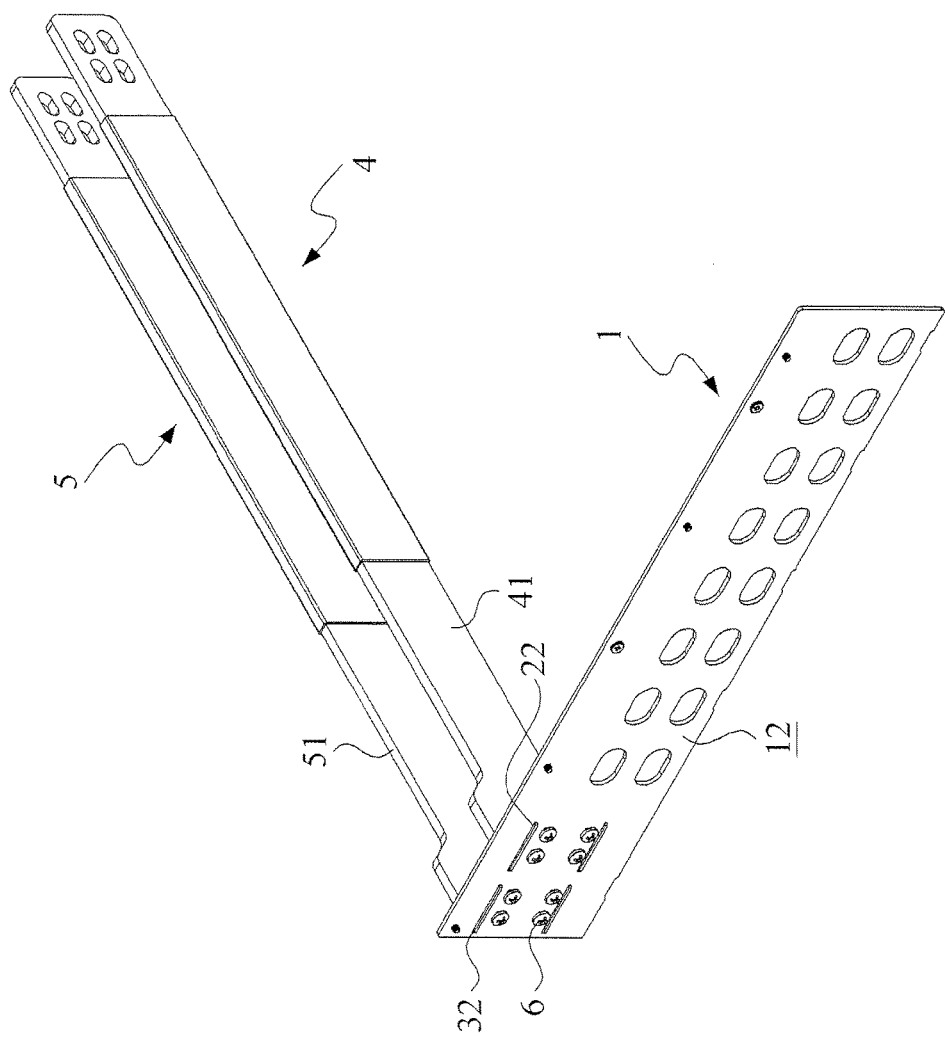
FIG. 3 is a three-dimensional schematic drawing in another view illustrating the circuit board assembly according to one preferred embodiment of the present invention.
Figure 4:
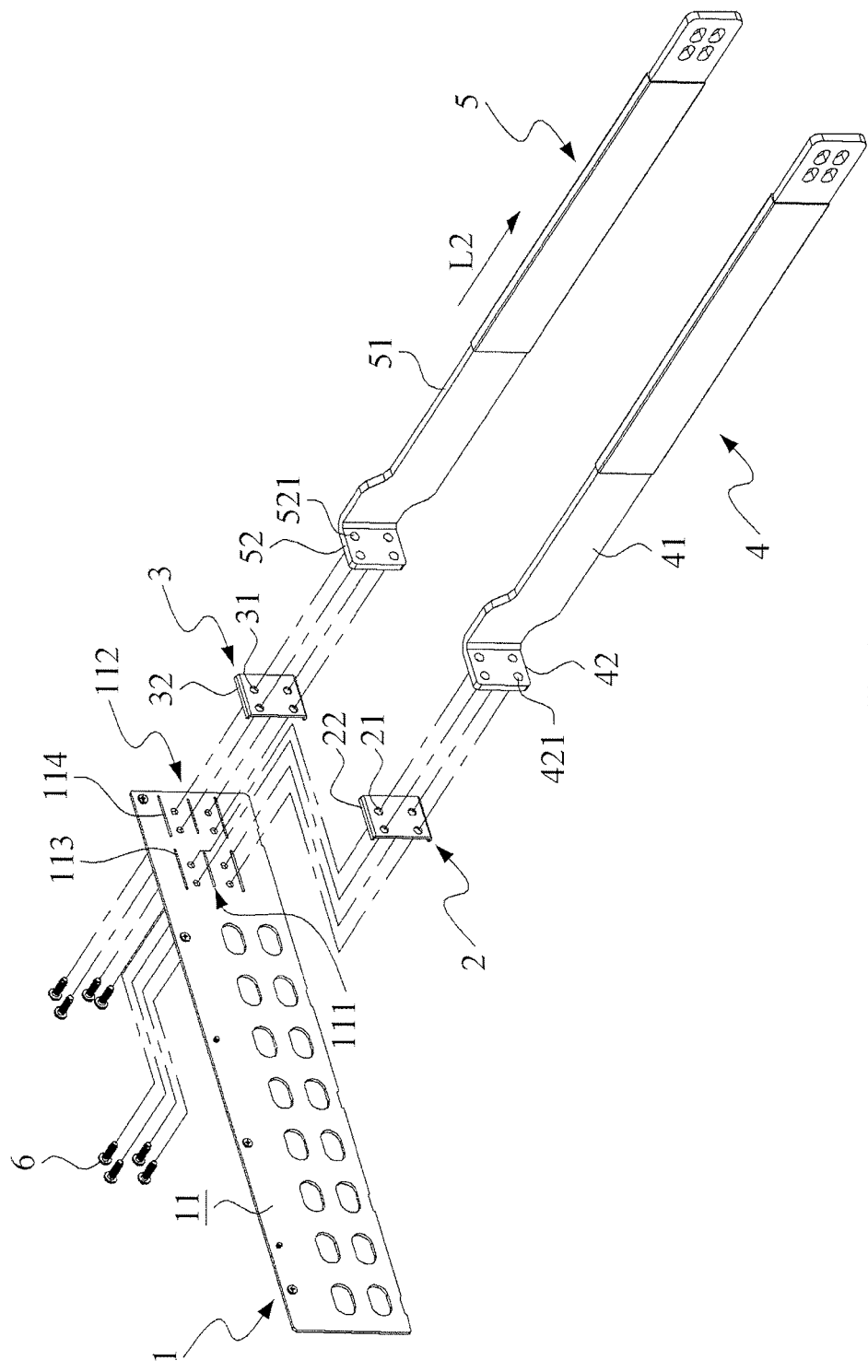
FIG. 4 is a exploded three-dimensional schematic drawing illustrating the circuit board assembly according to one preferred embodiment of the present invention.
Figure 5:
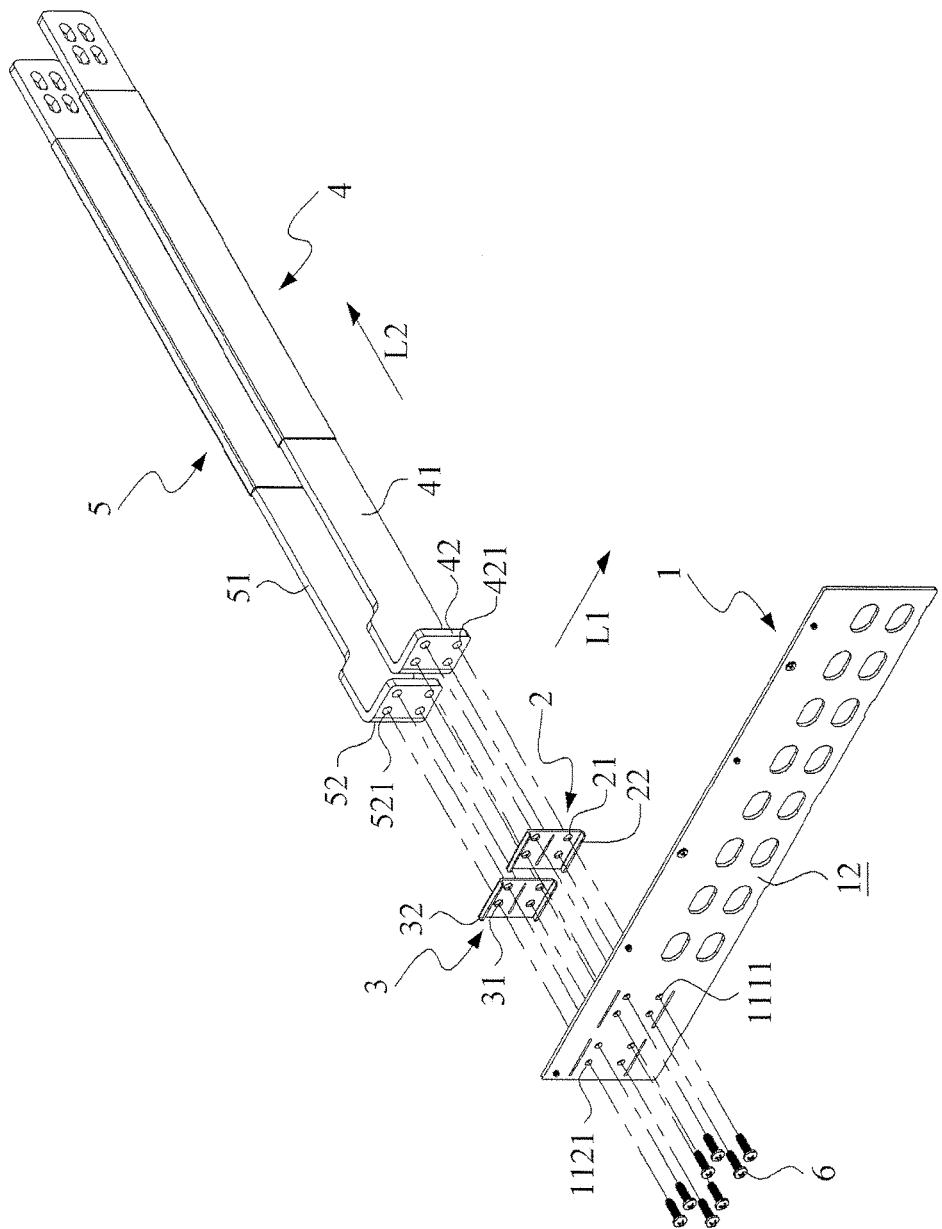
FIG. 5 is a exploded three-dimensional schematic drawing in another view illustrating the circuit board assembly according to one preferred embodiment of the present invention.

Referring to FIG. 2 to FIG. 5, FIG. 2 is a three-dimensional schematic drawing illustrating the circuit board assembly according to one preferred embodiment of the present invention; FIG. 3 is a three-dimensional schematic drawing in another view illustrating the circuit board assembly according to one preferred embodiment of the present invention; FIG. 4 is a exploded three-dimensional schematic drawing illustrating the circuit board assembly according to one preferred embodiment of the present invention; FIG. 5 is a exploded three-dimensional schematic drawing in another view illustrating the circuit board assembly according to one preferred embodiment of the present invention.

As shown in FIG. 2-FIG. 5, a circuit board assembly 100 includes a circuit board 1, two metal sheets 2, 3, two buses 4, 5, and eight fixed members 6 (FIG. 2-FIG. 5 just shows one).

The circuit board 1 is extended along a first extending direction L1, and has a bus disposing surface 11 and a fixed member locking surface 12 disposed opposite the bus disposing surface 11. The bus disposing surface 11 has two electrical connecting areas 111 and 112. The electrical connecting area 111 is configured with four circuit board locking holes 1111 (FIG. 2-FIG. 5 just shows one), and the electrical connecting area 112 is configured with four circuit board locking holes 1121 (FIG. 2-FIG. 5 just shows one). In addition, the bus disposing surface 11 is further configured with two positioning holes 113 (FIG. 2-FIG. 5 just shows one) and two positioning holes 114 (FIG. 2-FIG. 5 just shows one).

The two positioning holes 113 are adjacent to the electrical connecting area 111 and disposed in two sides of the electrical connecting area 111 symmetrically. The two positioning holes 114 are adjacent to the electrical connecting area 1121 and disposed in two sides of the electrical connecting area 112 symmetrically.

The metal sheet 2 is soldered to the electrical connecting area 111, and is configured with four metal sheet holes 21 (FIG. 2-FIG. 5 just shows one), and metal sheet 2 further has two positioning portions 22 (FIG. 2-FIG. 5 just shows one), wherein the two positioning portions 22 are wedged to the two positioning holes 113 correspondingly.

The metal sheet 3 is soldered to the electrical connecting area 112, and is configured with four metal sheet holes 31 (FIG. 2-FIG. 5 just shows one), and the metal sheet 3 further has two positioning portions 32 (FIG. 2-FIG. 5 just shows one). The two positioning portions 32 are wedged to the two positioning holes 114 correspondingly. Wherein, the metal sheet 2 and 3 of the present embodiment are copper sheets, but not limited to. In other embodiments, the material of the metal sheet also can be other materials of conductive metal.

In addition, in practice, a surface of the metal sheet 2 and 3 soldered with the electrical connecting areas 111 and 112 is further configured with multi-segment raised structures, and the electrical connecting areas 111 and 112 are configured with multi-segment concave structures relatively. Thus, when the metal sheet 2 and 3 are soldered to the electrical connecting areas 111 and 112, the coordination between the raised structure and the concave structure can make the soldering more tightly. This is, the soldering area can be increased in the soldering process.

The bus 4 includes a bus body 41 and a connecting portion 42, the bus body 41 is extended along a second extending direction L2 vertical to the first extending direction L1, and the connecting portion 42 is extended from the bus body 41 integrally corresponding to metal sheet 2 along first extending direction L1, and the connecting portion 42 is configured with four fixed screwing holes 421 corresponding to metal sheet holes 21.

The bus 5 includes a bus body 51 and a connecting portion 52. The bus body 51 is extended along the second extending direction L2 vertical to the first extending direction L1, and the connecting portion 52 is extended from the bus body 51 integrally corresponding to metal sheet 2 along the first extending direction L1. The connecting portion 52 is configured with four fixed screwing holes 521 corresponding to metal sheet holes 21. Wherein, the buses 4 and 5 of the present embodiment are copper pieces, but not limited to. In other embodiments, the material of the bus also can be other materials of conductive metal.

In addition, the buses 4 and 5 are configured with an insulating cover respectively in practice (figures not show).

Four of eight fixed members 6 are passed through the circuit board locking holes 1111 firstly, and then passed through the metal sheet holes 21. Next, the fixed members 6 are locked in the fixed screwing holes 421 for making the metal sheet 2 and bus 4 be locked on circuit board 1; the other fixed members 6 are passed through the circuit board locking holes 1121 firstly, and then passed through the metal sheet holes 31. Next, the fixed members 6 are locked in the fixed screwing holes 521 for making the metal sheet 3 and the bus 5 be locked on the circuit board 1. Wherein, the bus 4 can be contacted with the metal sheet 2 tightly for making the bus 4 electrically connect to the metal sheet 2 by the way which the nuts of the fixed members 6 are wedged in circuit board 1, and locked in the bus 4. In practice, the metal sheet 2 is soldered to the circuit of the circuit board 1. Thus, the bus 4 is electrically connected to the circuit of the circuit board 1 via the metal sheet 2; similarly, the bus 5 is also contacted tightly and electrically connected to the metal sheet 3 via the lock of the fixed members 6 similarly so as to electrically connected to the circuit of the circuit board 1 via the metal sheet 3.

In addition, in the present embodiment, the buses 4, 5 are locked on the circuit board 1 and the metal sheets 2, 3 by the fixed members 6 which acts in a rotational torque with the range of 20-40 kgf·cm for reducing a impedance value between the buses 4, 5 and the circuit board 1; wherein, when the fixed members 6 area screws of M5 specification, the chart of the rotational torque and the circuit loss between the buses 4, 5 and the circuit board 1 are shown in Table. 1, as follows:

TABLE 1

Chart of the rotational torque and the circuit loss.

| rotational torque | Load | | | | | |
|---|---|---|---|---|---|---|
| | 300 A | | | 400 A | | |
| | voltage drop (mV) | | circuit | voltage drop (mV) | | circuit |
| kgf · cm | bus 4 | bus 5 | loss (W) | bus 4 | bus 5 | loss (W) |
| 20 | 13.9 | 20.85 | 10.425 | 20.3 | 31.6 | 20.76 |
| 25 | 10.04 | 15.6 | 7.692 | 14.09 | 22.08 | 14.468 |
| 30 | 8.64 | 13.35 | 6.597 | 11.62 | 18.70 | 12.128 |
| 35 | 8.71 | 11.95 | 6.198 | 11.86 | 16.75 | 11.444 |
| 40 | 7.68 | 10.365 | 5.4135 | 10.37 | 14.11 | 9.792 |

As shown in the above table, when the rotational torque increases by degrees and be in the range of 20~40 kgf·cm, the impedance value decreases by degrees relatively.

Figure 6:
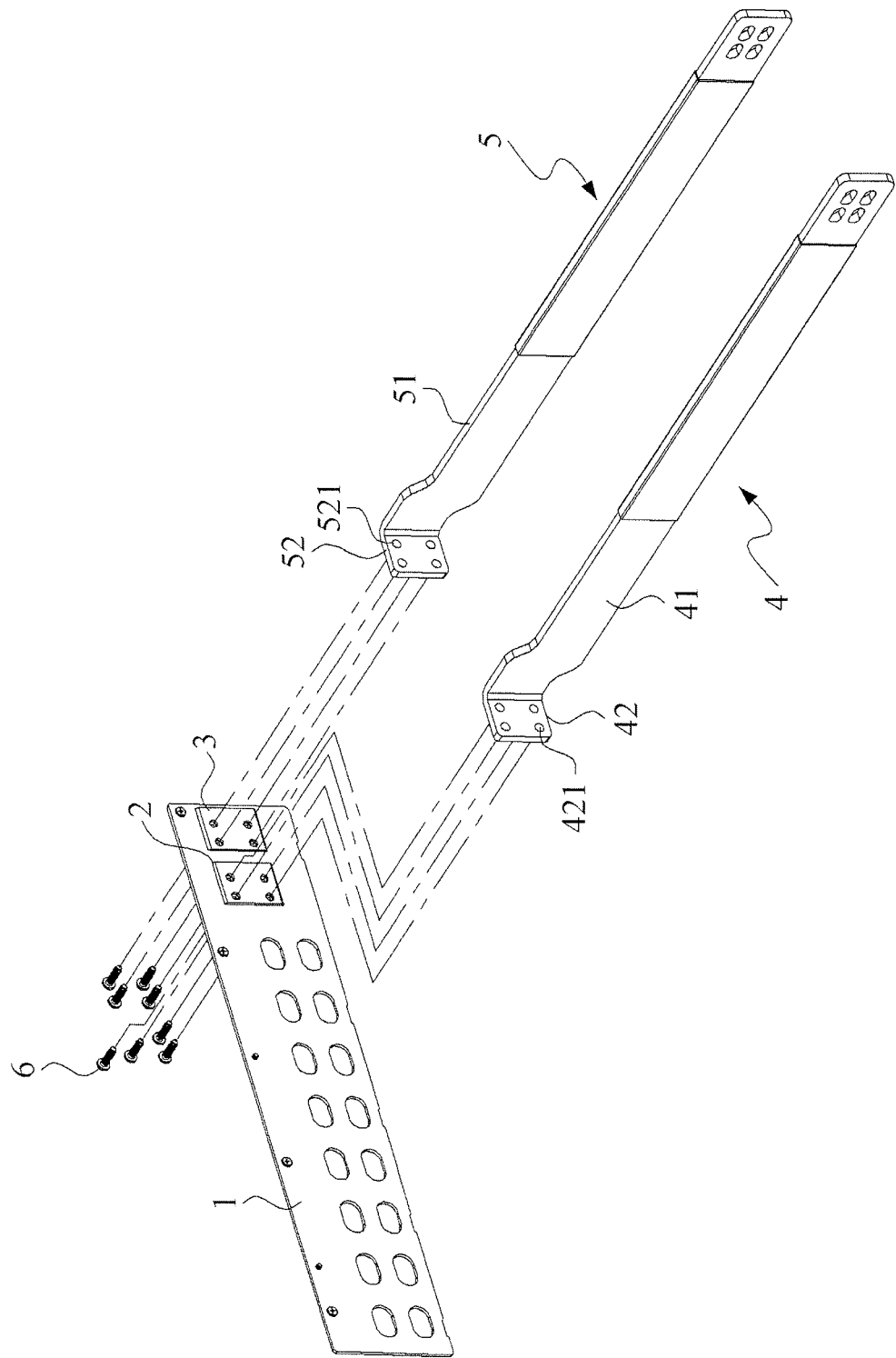
FIG. 6 is a three-dimensional schematic drawing illustrating the metal sheet is soldered to the circuit board according to one preferred embodiment of the present invention.
Figure 7:
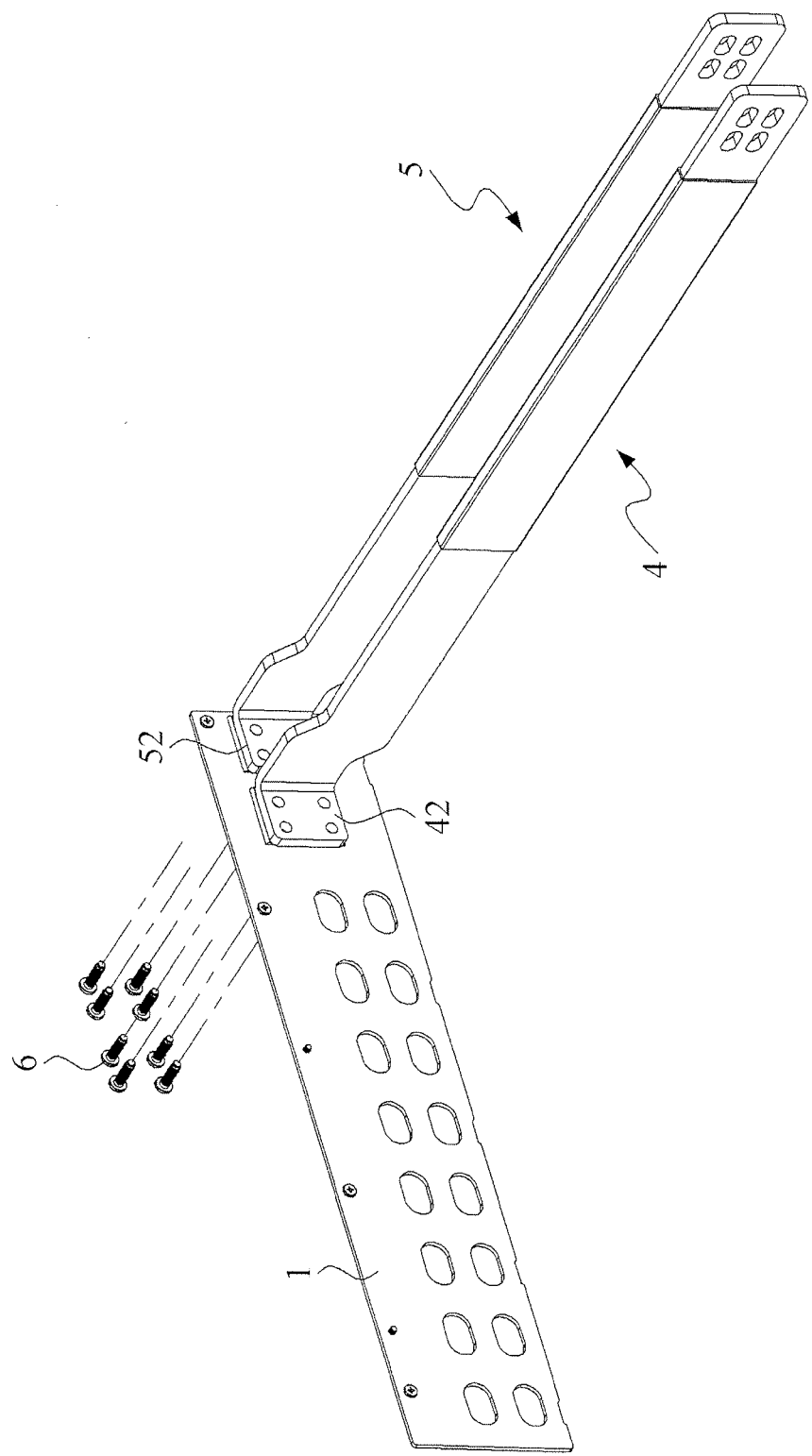
FIG. 7 is a three-dimensional schematic drawing illustrating the bus is disposed in the metal sheet and is fixed by the fixed member according to one preferred embodiment of the present invention.

Referring to FIG. 6 to FIG. 7, FIG. 6 is a three-dimensional schematic drawing illustrating the metal sheet is soldered to the circuit board according to one preferred embodiment of the present invention; FIG. 7 is a three-dimensional schematic drawing illustrating the bus is disposed in the metal sheet and is fixed by the fixed members according to one preferred embodiment of the present invention. As shown in FIG. 6 to FIG. 7, in practice, firstly, the metal sheets 2, 3 can be soldered to the electrical connecting areas 111, 112 respectively. Then, the buses 4, 5 can be configured to the metal sheets 2, 3 respectively. Finally, the buses 4, 5 can be locked on the circuit board 1 by the fixed members 6.

Figure 8:
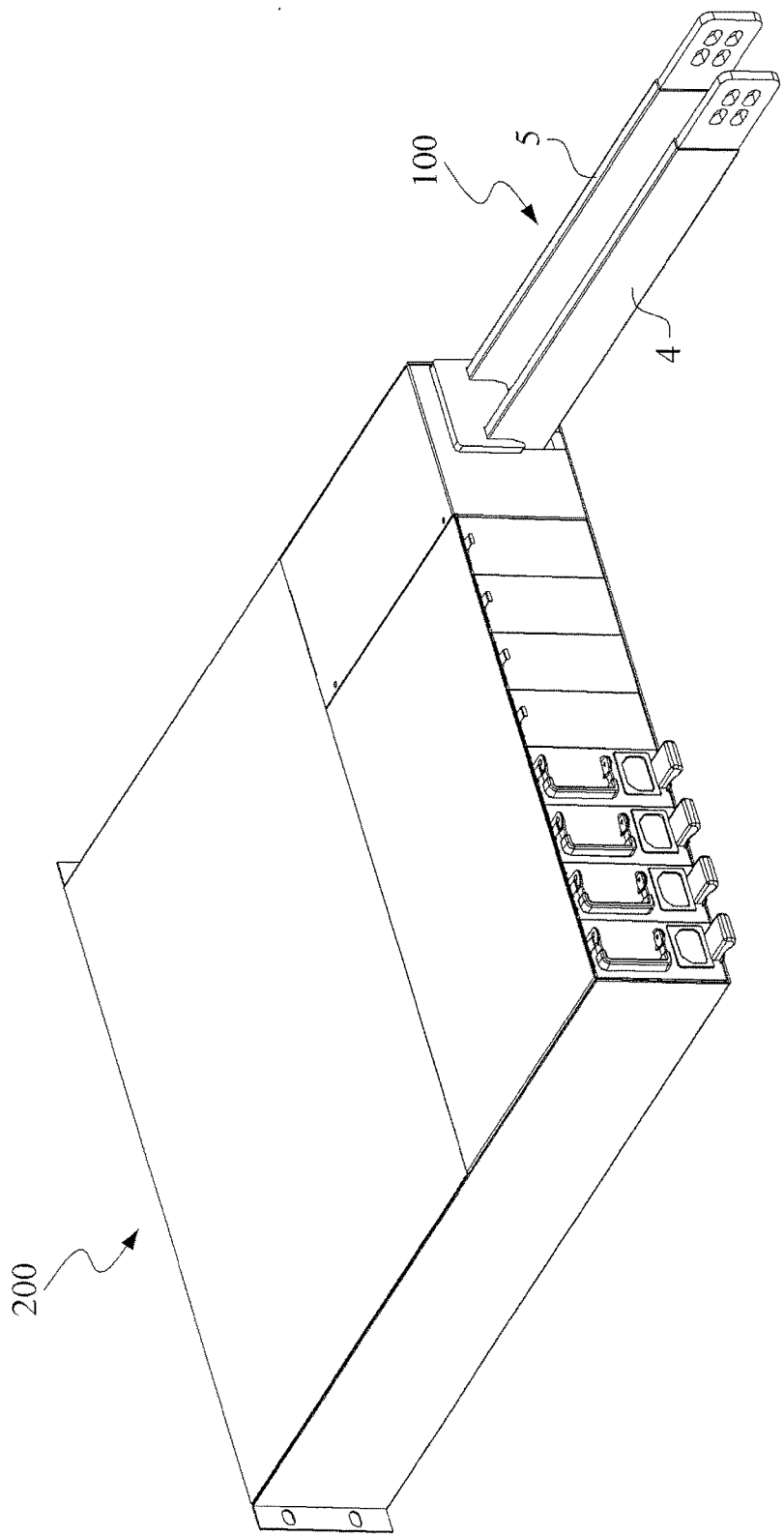
FIG. 8 is a three-dimensional schematic drawing illustrating the circuit board assembly is applied in the electronic device according to one preferred embodiment of the present invention.

Referring to FIG. 8, FIG. 8 is a three-dimensional schematic drawing illustrating the circuit board assembly is applied in the electronic device according to one preferred embodiment of the present invention. As shown in FIG. 8, the circuit board assembly 100 of the present invent is disposed in a electronic equipment 200, wherein the buses 4, 5 will penetrate from the electronic equipment 200, and be electrically connected to a power (not shown).

To sum up, compared to the circuit board assembly of prior art with plugging port for plugging by the bus directly, the present invent applies the metal sheet to electrically connect with the circuit board and the bus. Thus, the present invent can make the bus electrically connect to circuit board effectively, and increases the stability of the electrical connection between the bus and the circuit board. In addition, users can decrease the impedance value between the bus and the circuit board by increasing the rotational torque of the fixing member in the present invent.

While the present invention has been particularly shown and described with reference to a preferred embodiment, it will be understood by those skilled in the art that various changes in form and detail may be without departing from the spirit and scope of the present invention.

What is claimed is:

1. A circuit board assembly, comprising:
    a circuit board, having at least one electrical connecting area and at least one positioning hole adjacent to the electrical connecting area;
    at least one metal sheet, being adapted to solder to the electrical connecting area and having at least one positioning portion and at least one metal sheet hole;
    at least one bus, having a connecting portion, the connecting portion is corresponding to the metal sheet, and the bus has at least one fixed screwing hole, the fixed screwing hole is corresponding to the metal sheet hole; and
    at least one fixed member, locking the metal sheet and the bus via the metal sheet hole and the fixed screwing hole for making an electrical connection between the metal sheet and the bus;
    wherein the positioning portion is wedged in the positioning hole.

2. The circuit board assembly of claim 1, wherein the bus is locked on the circuit board by the fixed member with a rotational torque for reducing a impedance value between the bus and the circuit board, a range of the rotational torque is between 20-40 kgf·cm.

3. The circuit board assembly of claim 2, wherein when the rotational torque increases by degrees in the range of the rotational torque, the impedance value decreases by degrees relatively.

4. The circuit board assembly of claim 1, wherein the circuit board has at least one circuit board locking hole corresponding to the metal sheet hole, the metal sheet and the bus are locked on the circuit board by the fixed member via the circuit board locking hole.

5. The circuit board assemblies of claim 1, wherein there are plural positioning holes and positioning portions, the positioning holes are disposed around the electrical connecting area symmetrically, the positioning portions are wedged in the positioning holes correspondingly.

6. The circuit board assembly of claim 1, wherein the metal sheet is a copper sheet.

7. The circuit board assembly of claim 1, wherein the bus is a copper piece.

8. The circuit board assembly of claim 1, wherein the bus further includes a bus body, the connecting portion is extended from the bus body integrally by the way of bending.

9. The circuit board assembly of claim 8, wherein the extending direction of the connecting portion is vertical to the extending direction of the bus body.

* * * * *